(12) United States Patent
Sherry et al.

(10) Patent No.: US 11,467,183 B2
(45) Date of Patent: *Oct. 11, 2022

(54) INTEGRATED CIRCUIT CONTACT TEST APPARATUS WITH AND METHOD OF CONSTRUCTION

(71) Applicant: Johnstech International Corporation, Minneapolis, MN (US)

(72) Inventors: Jeffrey Sherry, Savage, MN (US); Joël Erdman, Waconia, MN (US)

(73) Assignee: Johnstech International Corporation, Minneapolis, MN (US)

( * ) Notice: Subject to any disclaimer, the term of this patent is extended or adjusted under 35 U.S.C. 154(b) by 114 days.

This patent is subject to a terminal disclaimer.

(21) Appl. No.: 17/063,279

(22) Filed: Oct. 5, 2020

(65) Prior Publication Data

US 2021/0018533 A1 Jan. 21, 2021

Related U.S. Application Data

(63) Continuation of application No. 15/621,548, filed on Jun. 13, 2017, now Pat. No. 10,794,933, which is a continuation of application No. 14/211,974, filed on Mar. 14, 2014, now abandoned.

(60) Provisional application No. 61/789,769, filed on Mar. 15, 2013, provisional application No. 61/787,253, filed on Mar. 15, 2013.

(51) Int. Cl.
*G01R 1/04* (2006.01)
*G01R 3/00* (2006.01)

(52) U.S. Cl.
CPC .............. *G01R 1/0466* (2013.01); *G01R 3/00* (2013.01)

(58) Field of Classification Search
CPC ................................. G01R 1/0466; G01R 3/00
See application file for complete search history.

(56) References Cited

U.S. PATENT DOCUMENTS

| 3,493,858 | A |  | 2/1970 | Baron et al. |
| 4,093,330 | A |  | 6/1978 | Pittman |
| 4,395,084 | A |  | 7/1983 | Conrad |
| 4,504,887 | A |  | 3/1985 | Bakemans et al. |
| 4,699,593 | A |  | 10/1987 | Grabbe et al. |
| 5,062,802 | A |  | 11/1991 | Grabbe |
| 5,083,236 | A | * | 1/1992 | Chason ................. H05K 1/186 333/204 |
| 5,302,853 | A |  | 4/1994 | Volz et al. |
| 5,306,167 | A |  | 4/1994 | Nagumo |
| 5,410,258 | A |  | 4/1995 | Bowers et al. |
| 5,451,165 | A |  | 9/1995 | Cearley-Cabbiness et al. |
| 5,484,295 | A |  | 1/1996 | Mowry et al. |
| 5,742,171 | A |  | 4/1998 | Matsunaga et al. |

(Continued)

*Primary Examiner* — Paresh Patel
(74) *Attorney, Agent, or Firm* — Hamre, Schumann, Mueller & Larson, P.C.

(57) ABSTRACT

A test socket for a device under test (DUT) is disclosed in several embodiments. One embodiment shows a test socket base (16) with apertures (30) for insertion of test pin insert blocks (28). The blocks are inserted top—in or bottom—in and are provided with registration bosses 80 and teeth 92 or other means for maintaining registration. Blocks are provided with dielectric constants to achieve different frequency response relative to other pins. To achieve great EMI and cross talk isolation, the socket may be made of aluminum with hard anodize coating to insulate test pins (32) from the housing.

5 Claims, 19 Drawing Sheets

(56) References Cited

U.S. PATENT DOCUMENTS

| | | | |
|---|---|---|---|
| 6,203,329 B1* | 3/2001 | Johnson | H01R 13/6585 |
| | | | 439/607.05 |
| 6,340,895 B1 | 1/2002 | Uher et al. | |
| 6,350,138 B1 | 2/2002 | Atobe et al. | |
| 6,369,594 B1 | 4/2002 | O'Keeffe | |
| 6,686,657 B1 | 2/2004 | Kline | |
| 7,090,522 B2 | 8/2006 | Sinclair | |
| 7,210,951 B2 | 5/2007 | Sinclair | |
| 7,404,719 B2 | 7/2008 | Osato et al. | |
| 7,625,219 B2 | 12/2009 | Osato et al. | |
| 7,871,283 B2 | 1/2011 | Murakoshi | |
| 10,794,933 B1* | 10/2020 | Sherry | G01R 3/00 |
| 2003/0224663 A1* | 12/2003 | Johnson | H01L 23/64 |
| | | | 439/620.09 |
| 2007/0236236 A1 | 10/2007 | Shell et al. | |
| 2007/0269999 A1* | 11/2007 | Di Stefano | G01R 1/06738 |
| | | | 439/73 |
| 2015/0054537 A1* | 2/2015 | Taber, Jr. | G01R 1/07314 |
| | | | 324/750.25 |
| 2016/0054384 A1 | 2/2016 | Shin et al. | |

\* cited by examiner

INTEGRATED CIRCUIT CONTACT TEST APPARATUS WITH AND METHOD OF CONSTRUCTION

BACKGROUND OF THE DISCLOSURE

Field of the Disclosure

The present disclosure is directed to equipment for testing microcircuits.

Background

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive pins arranged in a pattern that corresponds to both the terminals on the device under test and the electrical pads on the load board.

Consider an electrical chip that is manufactured to be incorporated into a larger system. When in use, the chip electrically connects the device to the larger system by a series of pins or terminals. For instance, the pins on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. Such component-level testing may help diagnose problems in the manufacturing process, and may help improve system-level yields for systems that incorporate the chips. Therefore, sophisticated test systems have been developed to ensure that the circuitry in the chip performs as designed. The chip is attached to the tester, as a "device under test", is tested, and is then detached from the tester. In general, it is desirable to perform the attachment, testing, and detachment as rapidly as possible, so that the throughput of the tester may be as high as possible.

The test systems access the chip circuitry through the same pins or terminals that will later be used to connect the chip in its final application. As a result, there are some general requirements for the test system that perform the testing. In general, the tester should establish electrical contact with the various pins or terminals so that the pins are not damaged, and so that a reliable electrical connection is made with each pin.

Most testers of this type use mechanical contacts between the chip pins and the tester contacts, rather than soldering and de-soldering or some other attachment method. When the chip is attached to the tester, each pin on the chip is brought into mechanical and electrical contact with a corresponding pad on the tester. After testing, the chip is removed from the tester, and the mechanical and electrical contacts are broken.

In general, it is highly desirable that the chip and the tester both undergo as little damage as possible during the attachment, testing, and detachment procedures. Pad layouts on the tester may be designed to reduce or minimize wear or damage to the chip pins. For instance, it is not desirable to scrape the device I/O (leads, pins, pads or balls), bend or deflect the I/O, or perform any operation that might permanently change or damage the I/O in any way. Typically, the testers are designed to leave the chips in a final state that resembles the initial state as closely as possible. In addition, it is also desirable to avoid or reduce any permanent damage to the tester or tester pads, so that tester parts may last longer before replacement.

There is currently a great deal of effort spent by tester manufacturers on the pad layouts. For instance, the pads may include a spring-load mechanism that receives the chip pins with a prescribed resisting force. In some applications, the pads may have an optional hard stop at the extreme end of the spring-load force range of travel. The goal of the pad layout is to establish a reliable electrical connection with the corresponding chip pins, which may be as close as possible to a "closed" circuit when the chip is attached, and may be as close as possible to an "open" circuit when the chip is detached.

Because it is desirable to test these chips as quickly as possible, or simulate their actual use in a larger system, it may be necessary to drive and/or receive electrical signals from the pins at very high frequencies. The test frequencies of current-day testers may be up to 40 GHz or more, and the test frequencies are likely to increase with future generation testers.

For low-frequency testing, such as done close to DC (0 Hz), the electrical performance may be handled rather simplistically: one would want an infinitely high resistance when the chip is detached, and an infinitesimally small resistance when the chip is attached.

At higher frequencies, other electrical properties come into play, beyond just resistance. Impedance (or, basically, resistance as a function of frequency) becomes a more proper measure of electrical performance at these higher frequencies. Impedance may include phase effects as well as amplitude effects, and can also incorporate and mathematically describe the effects of resistance, capacitance and inductance in the electrical path. In general, it is desirable that the contact resistance in the electrical path formed between the chip I/O and the corresponding pad on the load card be sufficiently low, which maintains a target impedance of 50 ohms, so that the tester itself does not significantly distort the electrical performance of the chip under test. Note that most test equipment is designed to have 50 ohm input and output impedances.

For modern-day chips that have many, many closely spaced I/O, it becomes helpful to simulate the electrical and mechanical performance at the device I/O interface. Finite-element modeling in two-or three dimensions has become a tool of choice for many designers. In some applications, once a basic geometry style has been chosen for the tester pad configuration, the electrical performance of the pad configuration is simulated, and then the specific sizes and shapes may be iteratively tweaked until a desired electrical performance is achieved. For these applications, the mechanical performance may be determined almost as an afterthought, once the simulated electrical performance has reached a particular threshold.

Test pins ultimately need replacement and furthermore the Device Under Test (DUT) may be modified to have altered pin locations. In order to deal with the first issue, replacement, it is normally necessary to carefully remove and replace individual pins. With respect to the second issue, changes in pin locations, prior art test sockets do not provide a means to move the pin alignment and thus the test socket must be completely replaced and redesigned. The present disclosure address both of these problems and others in unique solutions which offer rapid pin replacement, reusability of test sockets and importantly, an assurance of proper alignment of the installed pins.

Examples of microcircuit testers are shown in United States Patent Application Publication Number US 2007/0202714 A1 to Sherry and United States Patent Application Publication Number 2012/0282799 to Erdman and U.S. Pat. No. 7,059,866 to Gilk, U.S. Pat. No. 737,708 to Sherry, and U.S. Pat. No. 7,445,465 to Lopez et al, which are and incorporated by reference herein in its entirety.

Furthermore, cross talk between pins can be particular problem. Electrical (noise) isolation is very difficult because of the close tolerances.

The present disclosure addresses these issues amongst others.

BRIEF SUMMARY OF THE DISCLOSURE

In one embodiment there is disclosed a test fixture for forming a plurality of temporary mechanical and electrical connections between a device under test having a plurality of terminals having one more of the following elements:

a. a test socket contact block having a central recess area for receiving a device under test (DUT) said recess defining a peripheral 4-sided boundary walls adjacent the inner periphery of the recess area for receiving and aligning said DUT, bottom;

b. a test socket base having a top surface and bottom surface, said top surface configured to abut the bottom of said test socket block and having a plurality of test pins groups at least partially accessible through the recess area, so that when a DUT is placed in the recess area, contacts on the DUT can engage test pins;

c. at least one of said test pin groups being a removable insert of test pins, received within an insert aperture in the base sized to receive said insert;

d. Said insert aperture including a front wall located in said recess area and generally parallel with at least one boundary walls; a rear wall generally parallel with said front sidewall and spaced apart therefrom outside of said recessed area; first and second longitudinal sidewalls generally orthogonal to said front and rear; said longitudinal walls including at least one alignment boss thereon protruding into said insert aperture; thereby forming the boundaries of said insert aperture; said e. said insert including a block, sized to be received within said insert aperture, said insert block including a pair of spaced apart longitudinal insert walls; a pair of spaced part end walls and a plurality of spaced part slots for slideably receiving test pins; a pair of generally planar contact surface wall which form at least a part of said longitudinal walls and resilient engagement edge generally parallel at least one of said end walls; said engagement edge including a plurality of teeth;

f. said longitudinal insert walls being sized to engage said alignment bosses when inserted into said insert aperture to and said teeth engaging with a portion of said test socket base to precisely align said test pins;

so that when said DUT is inserted into said recess area, said test pins in said insert block are reliably aligned with contacts on said DUT.

Also disclosed is that teeth form a part of one of said end walls to engage said rear wall of said insert aperture.

Also disclosed is that where said insert aperture includes a bridge member spanning said longitudinal walls and wherein said teeth are configured to engage said bridge member.

Also disclosed is wherein said insert block includes a notch for receiving said bridge member and wherein said notch straddles said bridge member when inserted into said aperture.

Also disclosed is wherein said inset block is configured to insert from the underside of the base and wherein said block is prevented from being removed from the topside of the base.

Also disclosed is wherein a portion of block is larger than the aperture on the topside of the aperture thereby preventing removal of the block therethrough.

Also disclosed is wherein said insert block is configure to be inserted from the topside of the base and wherein the base further includes lateral recesses and a cross bar to prevent upward remove of the block through the topside once the bar is in place.

Also disclosed is wherein said rear wall of said aperture includes a slanted wall and a lip at its distal end and wherein said insert block includes a catch at one end, and wherein said catch engaged said lip after insertion into the aperture to prevent removal thereof.

Also disclosed is wherein said rear wall of said aperture includes a wall projecting into the space defined by the aperture adjacent the top surface of the base and wherein the insert includes a mating projection configured to engage the wall projection so that the engagement of the projections prevents removal of the insert through the top surface.

Also disclosed is a test socket contact block having a central recess area for receiving a device under test (DUT) said recess defining a peripheral 4-sided boundary walls adjacent the inner periphery of the recess area for receiving and aligning said DUT, bottom
   a. a test socket base having a top surface and bottom surface, said top surface configured to abut the bottom of said test socket block and having a plurality of test pins at least partially accessible through the recess area, so that when a DUT is placed in the recess area, contacts on the DUT can engage test pins;
   b. at least one of said test pins being a removable test pin insert, received within an insert aperture in the base sized to receive said insert;
   c. an insert block, having a first portion sized to be received within said insert aperture, and a second portion extending from said first portion and having at least one lip to abut the bottom surface of said base, said block including a slot for slidably receiving a test pin;
   wherein said insert block is prevented from being removed from the base through the top surface by engagement of the lip against the base.

Also disclosed is wherein said block includes a front and rear edge and a lip on both edges at least two lips on said second portion.

Also disclosed is wherein said second portion includes a channel generally orthogonal between said front and rear ends, said channel sized to receive an retainer for retaining the test pin in the insert.

Also disclosed is wherein said insert is a dielectric material of a predetermined dielectric constant and wherein the width of said insert block is selected to create a test pin impedance of user desired value so that the test pin contained therein will be able to test signals in the DUE within a user desired frequency response range.

Also disclosed is wherein said block includes a contact pin has at least two ridges configured to rotate about said axis from a first orientation wherein said first end 26 of said contact 24 is initially engaged by the lead 58 of the DUT, to a second orientation wherein said contact 24 is in a test configuration.

Also disclosed is a method of intermixing test pins capable of different DUT frequency response capabilities comprising any of the steps of, in any order:
   a. forming a test socket base having a contact portion to receive test pins to engage contacts of a DUT, said test socket being of a predetermined first material having a known frequency range for a known spacing of test pins;
   b. removing a portion of the contact portion of the base;
   c. inserting an insert block of as second material having a different dielectric constant relative said first material, said insert block including at least one test pin;
   d. forming said insert block so that it replaces said portion removed;
   so that the frequency response of said at least one test pin in said block is user selectable regardless of the frequency response of the other test pins.

Also disclosed is the step of forming said insert block with flanges larger than said portion removed so that said block may not be removed through the aperture created by the portion removed.

Also disclosed is a test assembly for testing integrated circuits comprising:
   a. a test socket for receiving a device under test (DUT), said socket including a plurality of test pins aligned to engage contacts on said DUT when in test mode; said pins including a tip contact end to engage said DUT and a bottom contact;
   b. an interface board under said test socket on its top surface and in contact with a load board on its bottom surface, said interface board having at least conductive traces on the top surface at locations adjacent said bottom ends of said pins and electrical traces on said bottom surface adjacent like contacts on said load board, and at least one electrical via between said top and bottom traces,
   c. wherein said at least one bottom trace is collinear with an axis running through said tip, said interface board to said load board;
   so that said tip is effectively connected to the load board directly below said tip on the bottom surface of the interface by said via.

Also disclosed is a test socket for use in testing an integrated circuit device under test (DUT) optimized for EMI pin isolation, comprising a test socket block having a recess area having a base for receiving a DUT and a plurality slots defining parallel sidewalls, in said base for receiving test pins; said block being made of an electrically conductive material to minimize EMI and crosstalk between pins, said sidewalls being coated with a non conductive oxide to prevent electrical contact between the block and said pins.

Also disclosed is the material is aluminum and wherein said oxide is aluminum oxide applied by hard anodization.

Also disclosed is a method of making an integrated circuit test socket for a device under test (DUT) which minimizes EMI and cross talk between test pins comprising the steps of:
   a. forming a test socket from electrically conductive material
   b. cutting slots in the material wide enough to accommodate:
      1. test pins slideable in the slots plus;
      2. a dielectric coating on the walls of the slots which contact said pins;
   c. hard anodizing said material including said slots.

DETAILED DESCRIPTION OF THE DISCLOSURE

Test sockets, such as that shown in and US Publication No. 2012/0282799 to Erdman incorporated herein by reference, are designed to receive an device to be tested, DUT or device under test, within a rigid frame which holds the DUT in place during test and insures precise alignment of test pins which are housed within the test socket typically a series of parallel grooves which allow for vertical or rotational movement of the pin, but not lateral or sideways movement which would result in misalignment of the test pin vis-a-vis the DUT contact. The socket includes a recess area for receiving the DUT.

Figure 9:
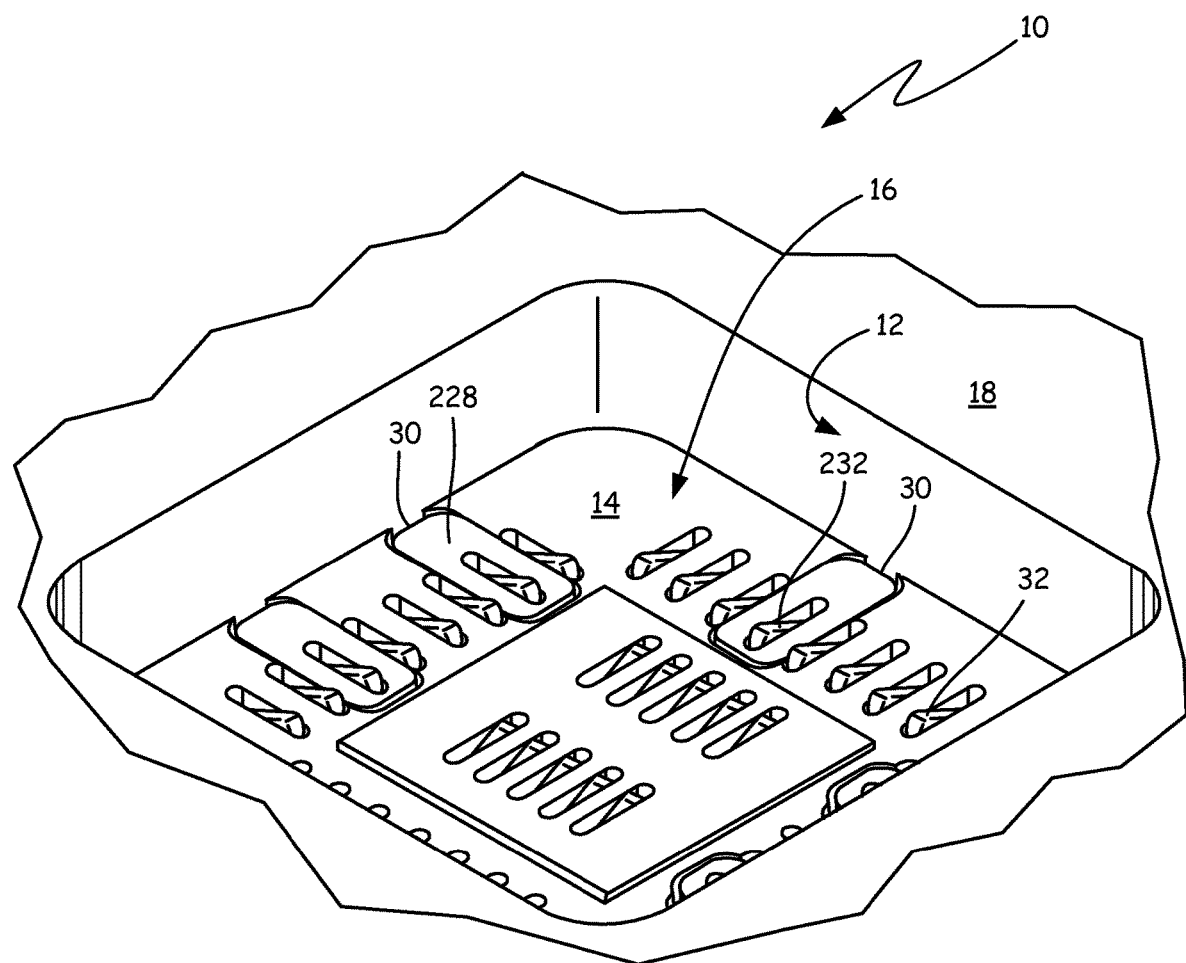
FIG. 9 is a top perspective view of a further embodiment with curved insert blocks and a hard stop pedestal with pins.
Figure 10:
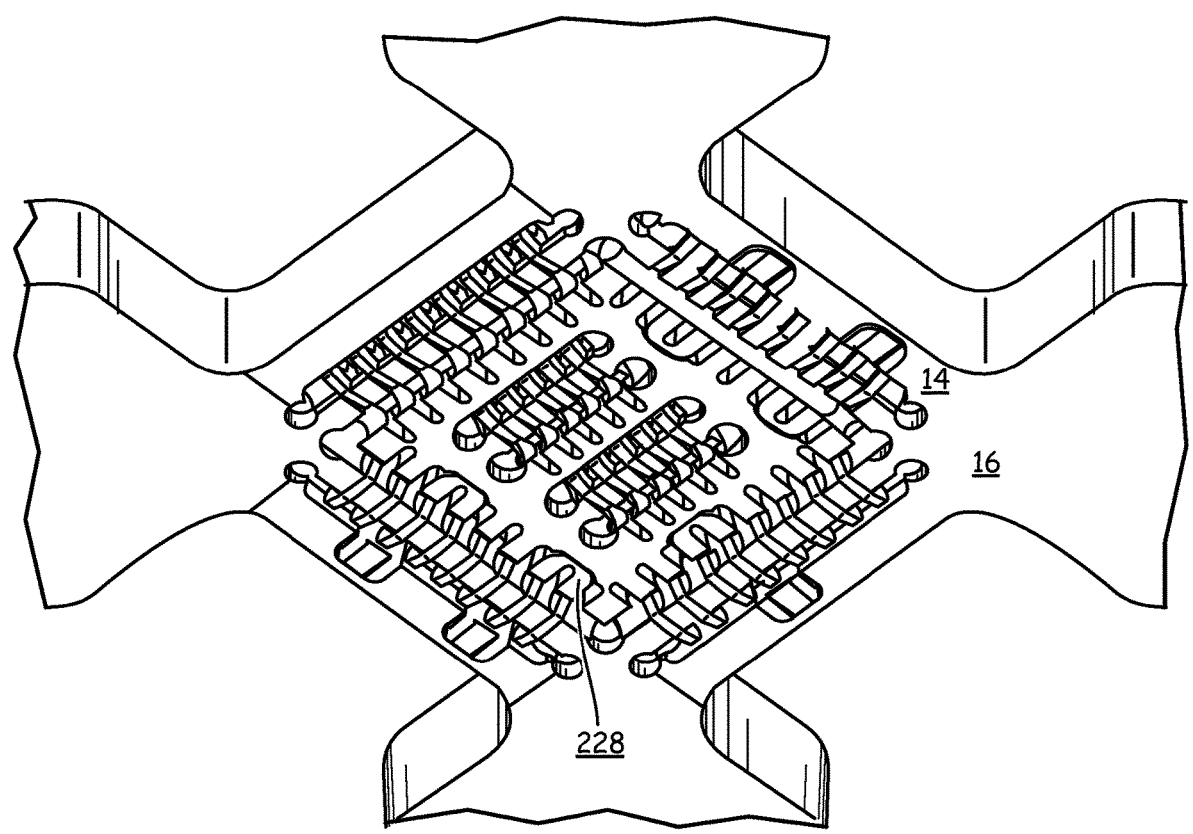
FIG. 10 is a bottom view of FIG. 9.
Figure 11:
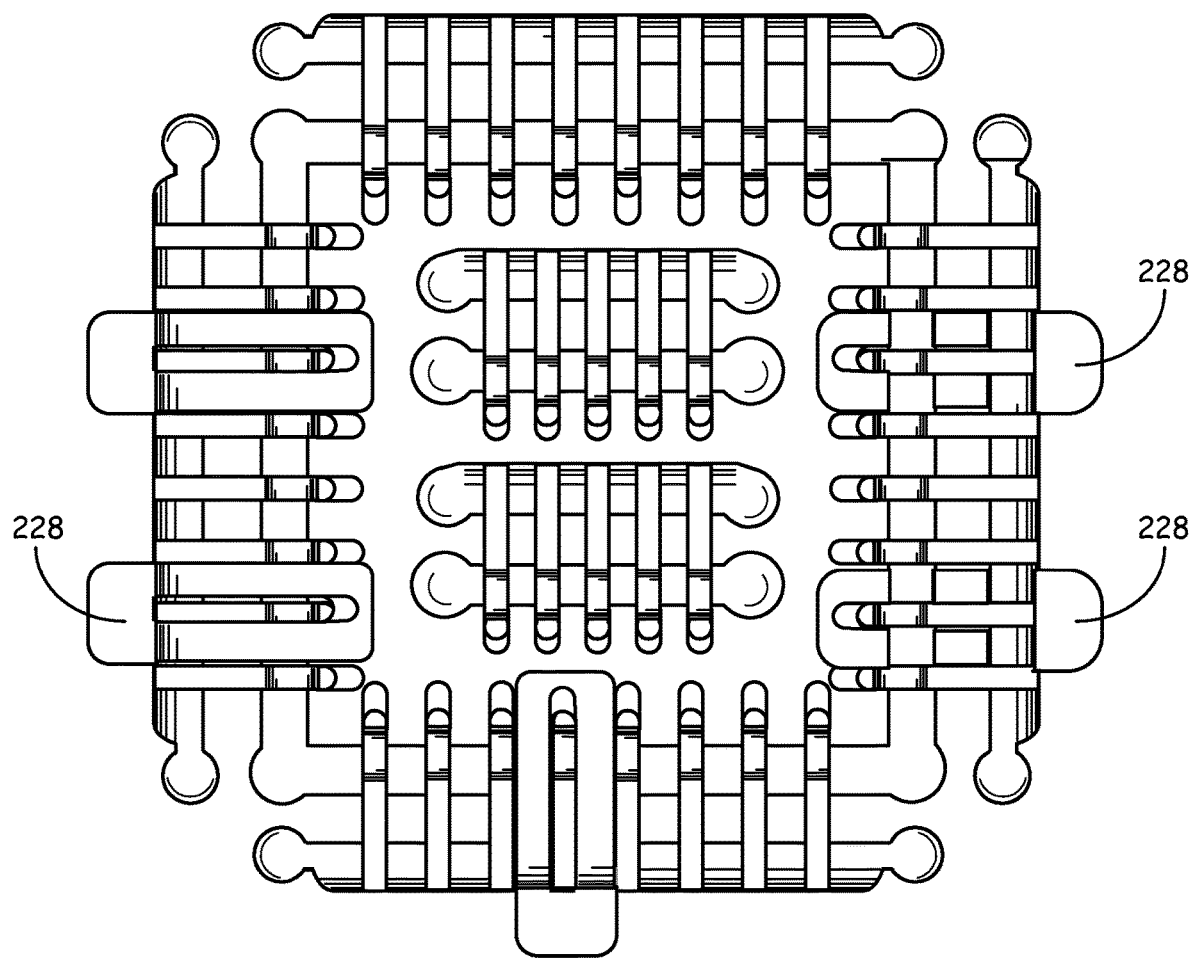
FIG. 11 is a top plan view of FIG. 9.
Figure 12:
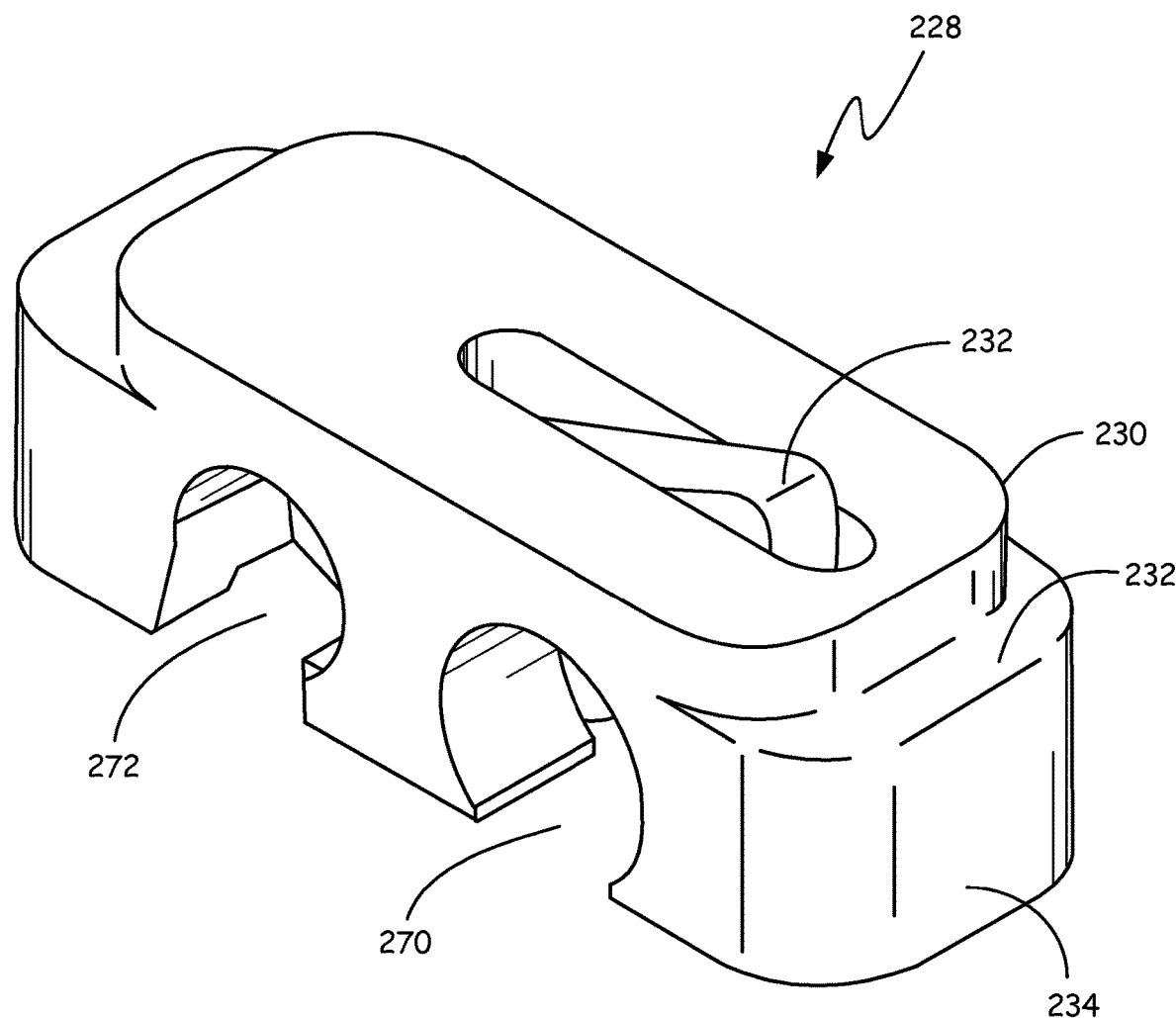
FIG. 12 is a close up top perspective view of a curved insert from FIG. 9.
Figure 13:
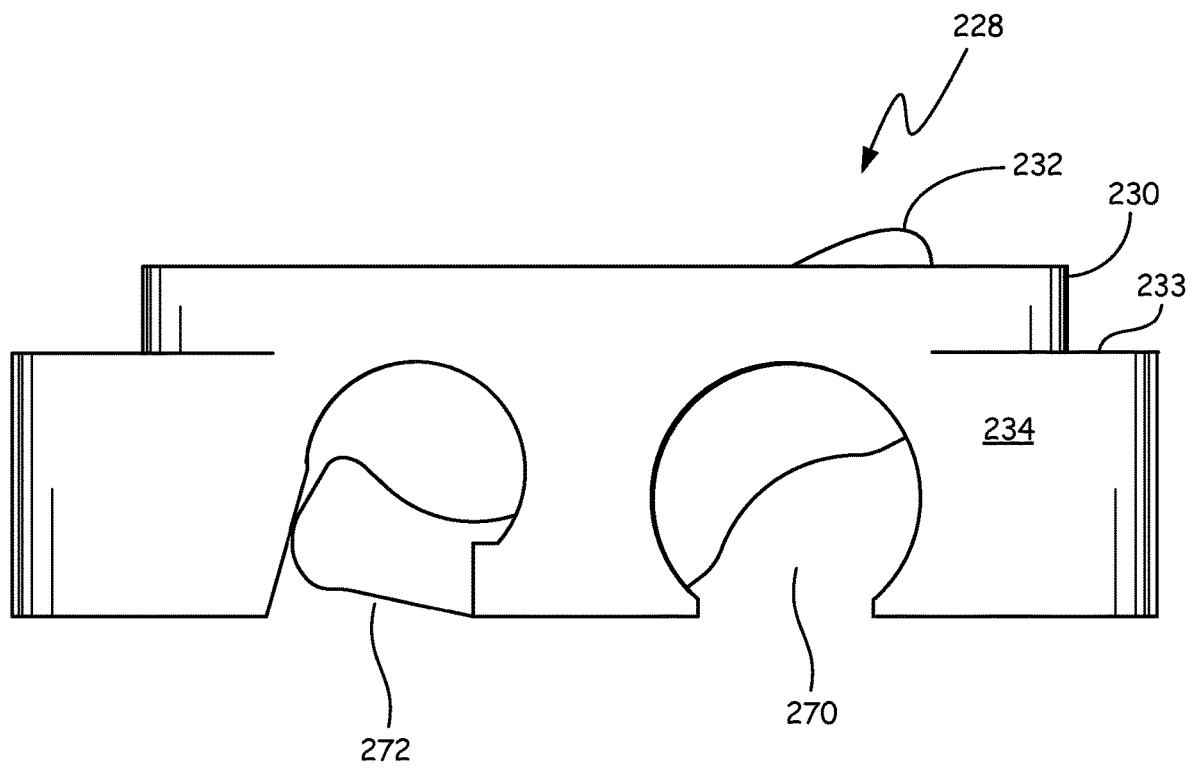
FIG. 13 is a side plan view of the insert of FIG. 12.

FIG. 9 illustrates a portion of a test socket 10 having a recessed area 14 defined by a boundary wall 12 which is typically rectangular. If the socket is made in two or more parts, there is a test socket base 16 which abuts the upper portion 18 to form the socket 10.

Figure 1:
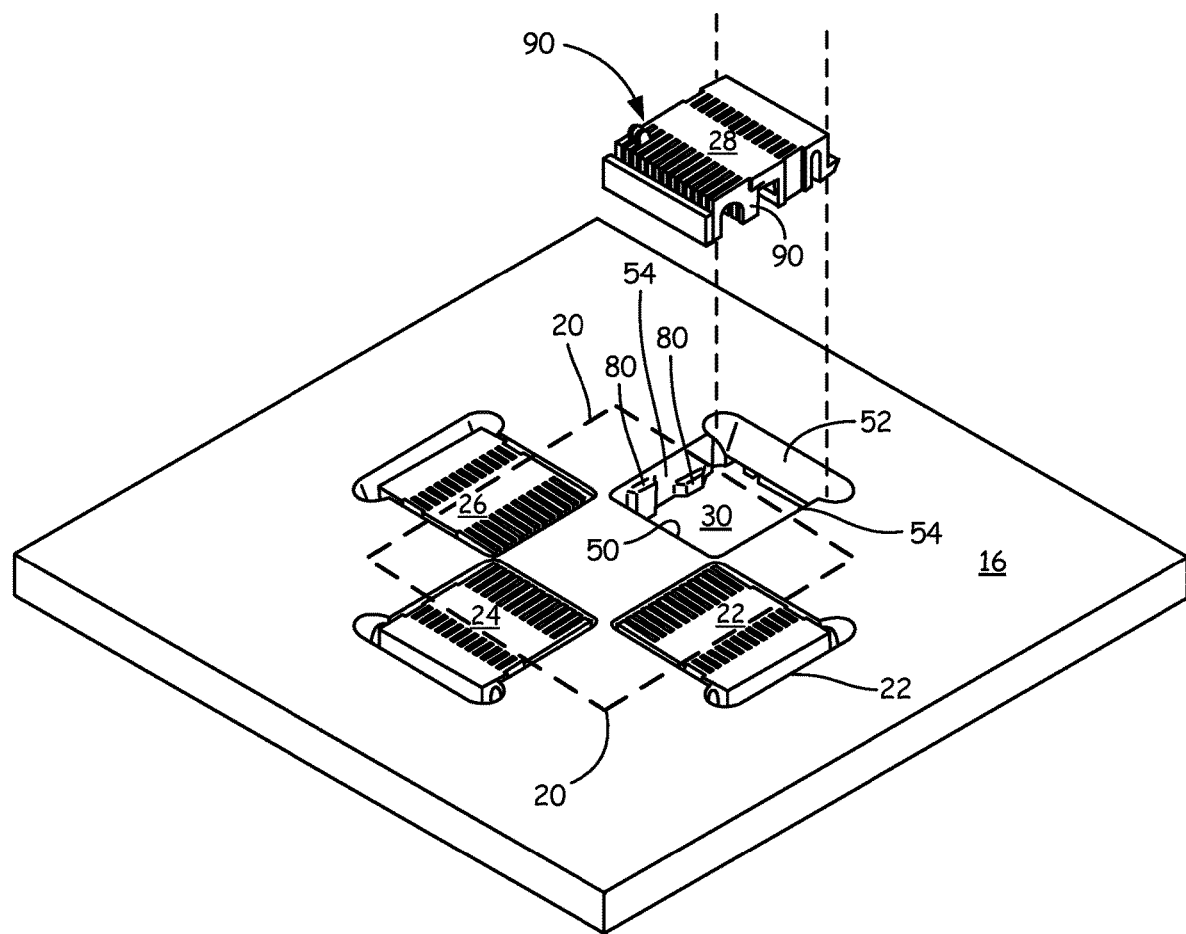
FIG. 1 is a top plan view of a housing and top insert embodiment.

FIG. 1 shows only the top surface of base 16 of the socket with the upper portion removed. The recessed area which would appear on the base is shown in broken line 20 as a boundary line of where the recess wall would contact the base.

The base is shown with 4 test pin groups 22, 24, 26, and 28 which may be fixed or removable. For efficiency only block 28 will be described in detail but it is understood that this description applies to all like blocks. In this embodiment they are all shown as removable. The base 16 is milled or formed to have an insert aperture 30 to receive a pin insert block such as 28.

Figure 17:
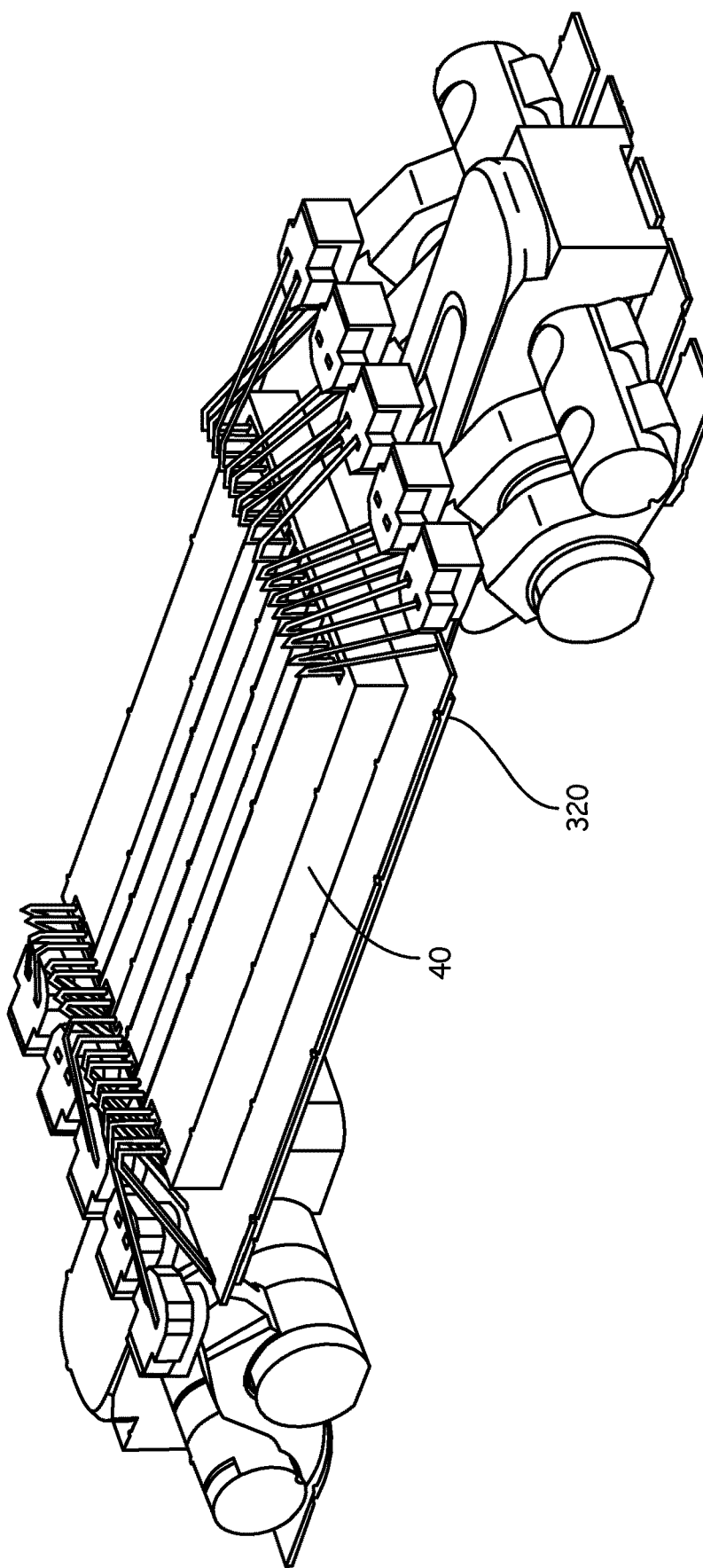
FIG. 17 is a top perspective view of the embodiment in FIG. 14 with a DUT in place and portions broken away.
Figure 18:
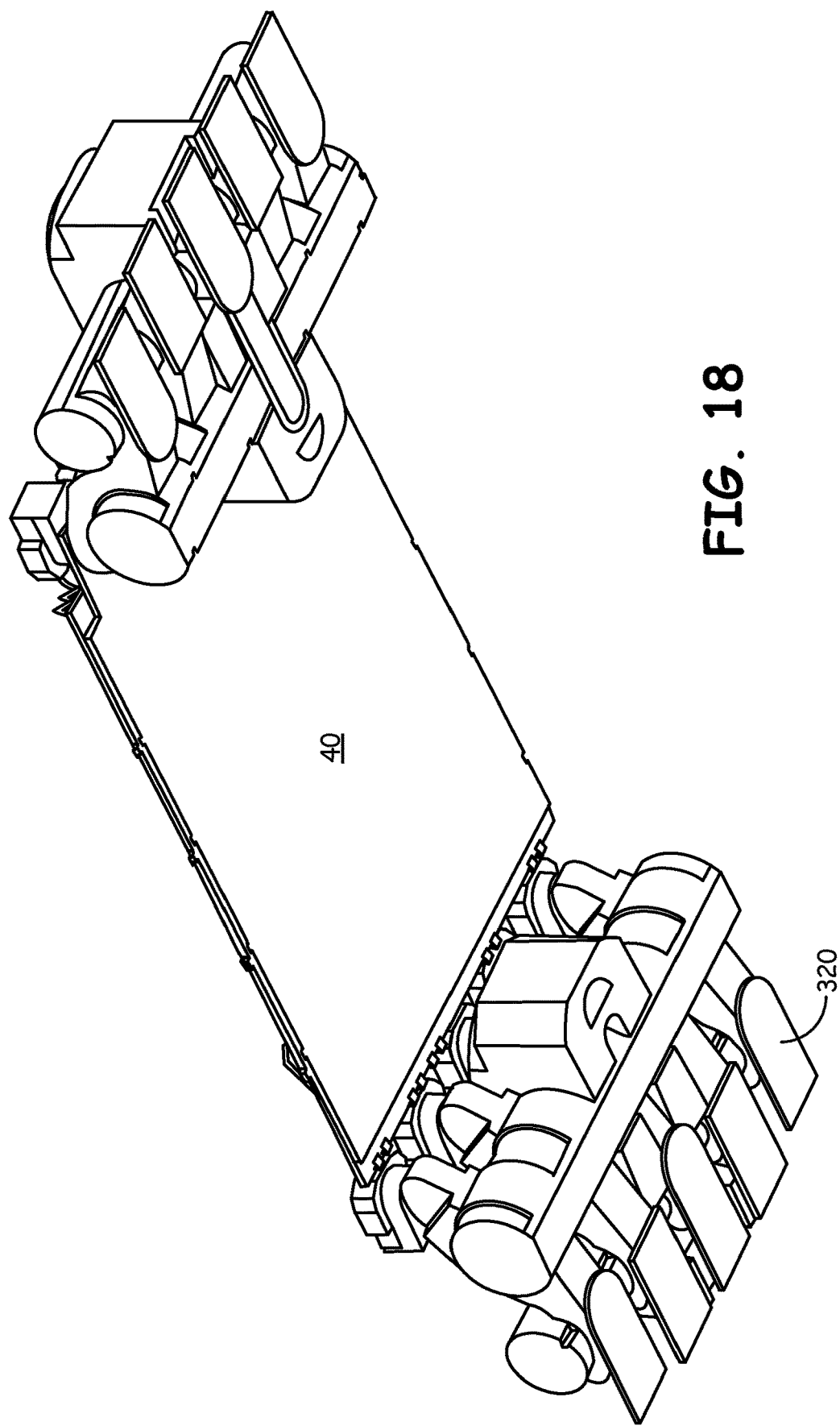
FIG. 18 is a bottom perspective view of FIG. 17.

The blocks have slots 68 (FIG. 2) which are sized to receive test pins 32 which are moveable and may protrude from the top surface of the block in order to make contact with contacts on the DUT 40 (FIG. 17, 18).

In this embodiment, the insert 28 is press fit into the base aperture 30 from the topside down. In other embodiments, it is fit from the bottom side up. The form has the advantage that the inserts can be replaced without disassembly of the test socket, and the later is advantageous because the insert cannot be pulled out of the socket by faulty contact with a DUT or by some other force.

Insert aperture 30 has a front wall 50, rear wall 52 and spaced apart side walls 54. The rear wall 52 may be beveled away from the front wall to allow clearance for insertion of the insert 28, as see more clearly in FIG. 6 which provides a close up view. Wall 52 provides and overhang projection 60 into the lower portion of the aperture which can make locking engagement with lip on insert 28. The bevel on wall 52 allows insert 28 to be inserted "toe in" with lip 62 going under projection 60 and then the tail (which is really the front 64 of the insert to be pressed into place. Lip 62 and its associated arm may allow sufficient compression to allow the insertion to be completed by virtue of pressure relief slot 76. The location of lip 62 and projection 60 are such that when inserted, the top surface of the insert will be flush with the top surface of the base 17.

Insert block 28 has a plurality of spaced apart slots 68 to receive pins 32 in slidable engagement. The pins shown function similarly to pins described in the incorporated references so further discussion of their function is not necessary. Insert block 28 includes cross passages 70 and 72 which are provided as space for elastomeric rods. Slots 68a are optional extensions of slots 68.

To maintain accurate placement of the pins (so they align properly with the DUT contacts) it is important that the insert be carefully milled/formed. Preferably the distance between the outer walls 90 (see FIGS. 1 and 2), is precise. To insure that the insertion maintains this precision, bosses or projections 80 (shown most clearly in FIGS. 1 and 2), project into the space from the inside surfaces of the longitudinal walls of the aperture 30 to engage walls 90 for precision lateral alignment. Longitudinal alignment is more easily achieved because the tip of pin 32 has more contact surface.

Figure 2:
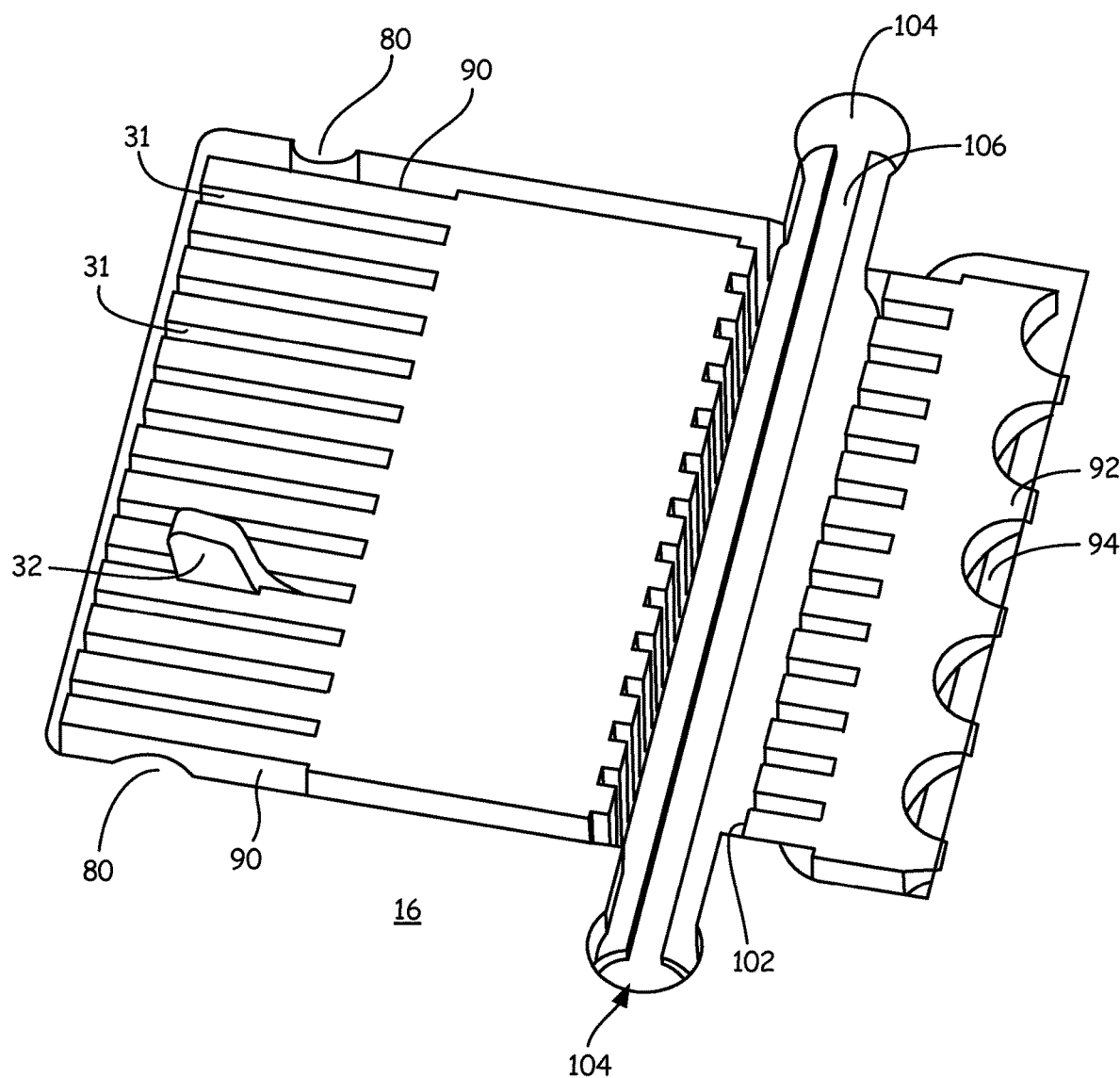
FIG. 2 is a close up fragmentary top perspective view of a portion of FIG. 1 inserted.
Figure 5:
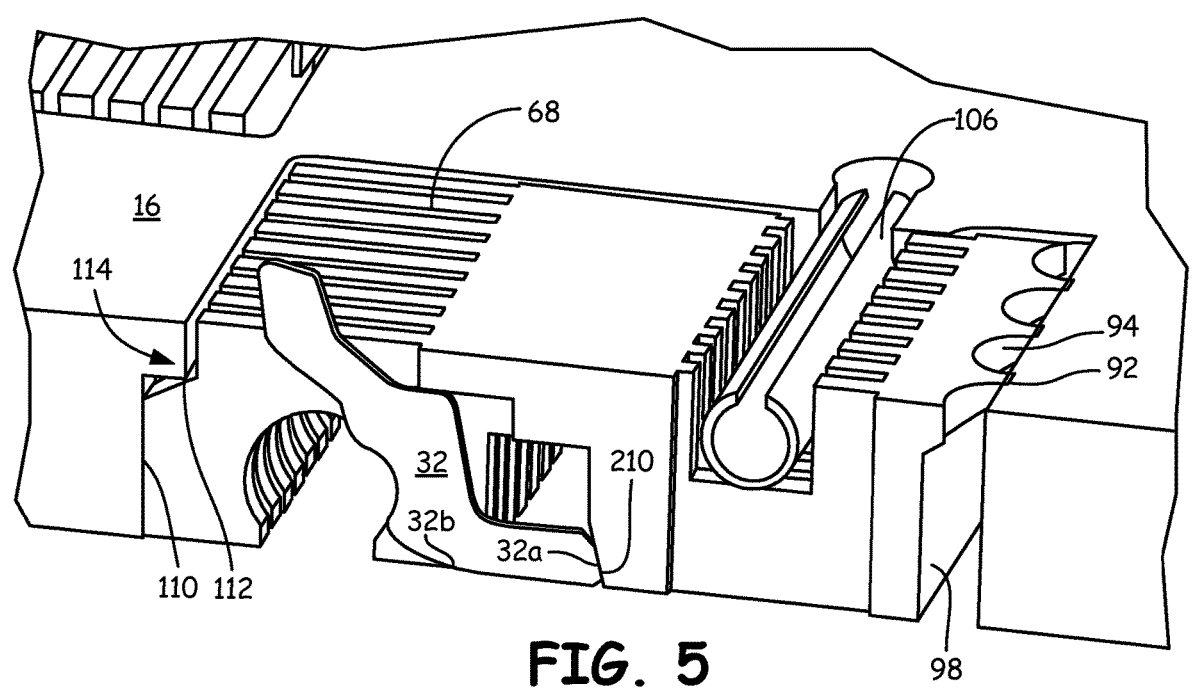
FIG. 5 is a side perspective fragmentary view of a housing and bottom insert.
Figure 6:
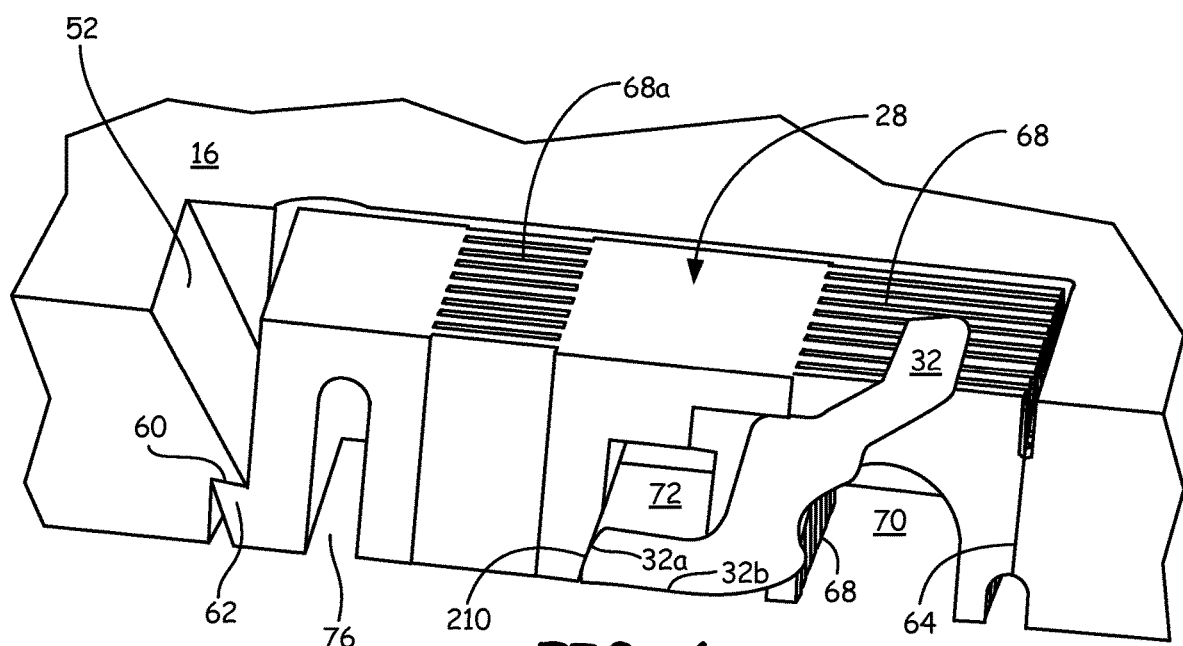
FIG. 6 is a side perspective fragmentary view of an alternate bottom insert embodiment

An alternative top insertion embodiment is shown in FIGS. 2, 5 and 6. In this embodiment, teeth 92 with valleys 94 provide a slight compressibility to maintain the insert fit into the aperture 30. Teeth are defined as form of projection which has greater compressibility than the material from which they extend. Valleys 94 create this slight compressibility. Below the teeth is a cut back portion 98.

Figure 7:
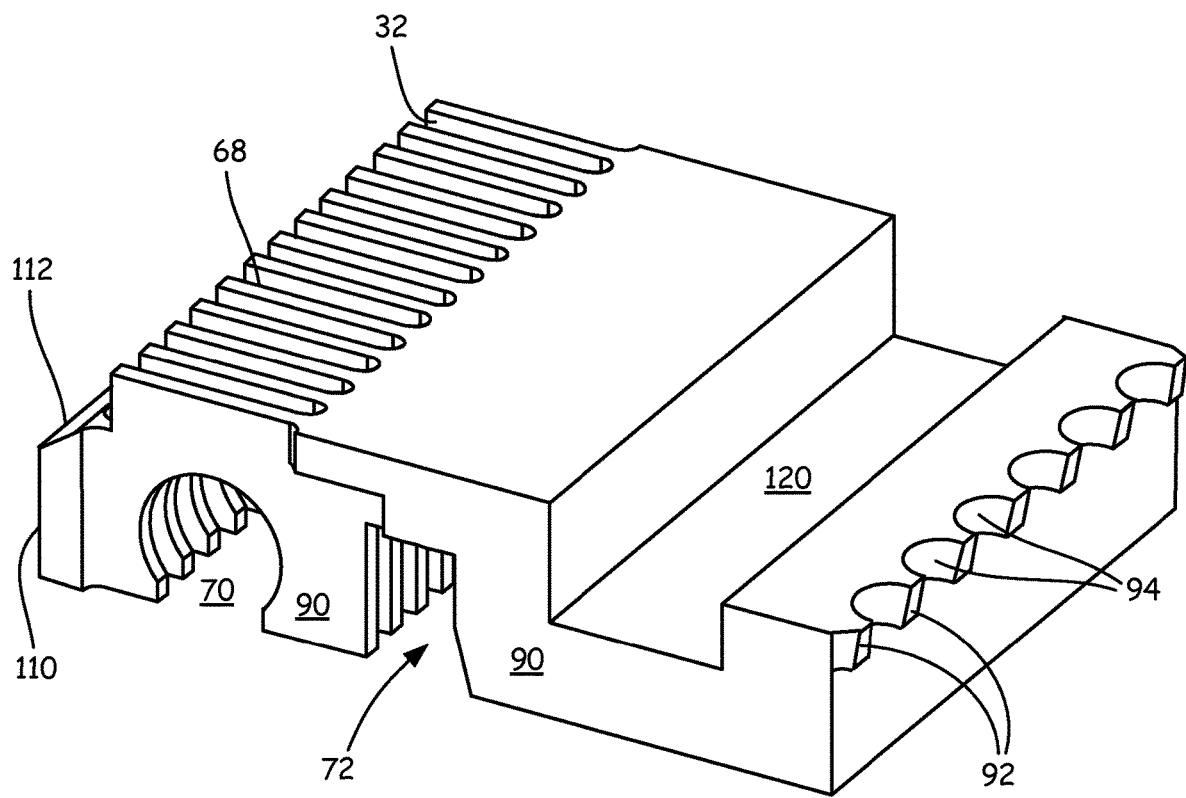
FIG. 7 is a close of perspective view of the insert in FIG. 5.
Figure 8:
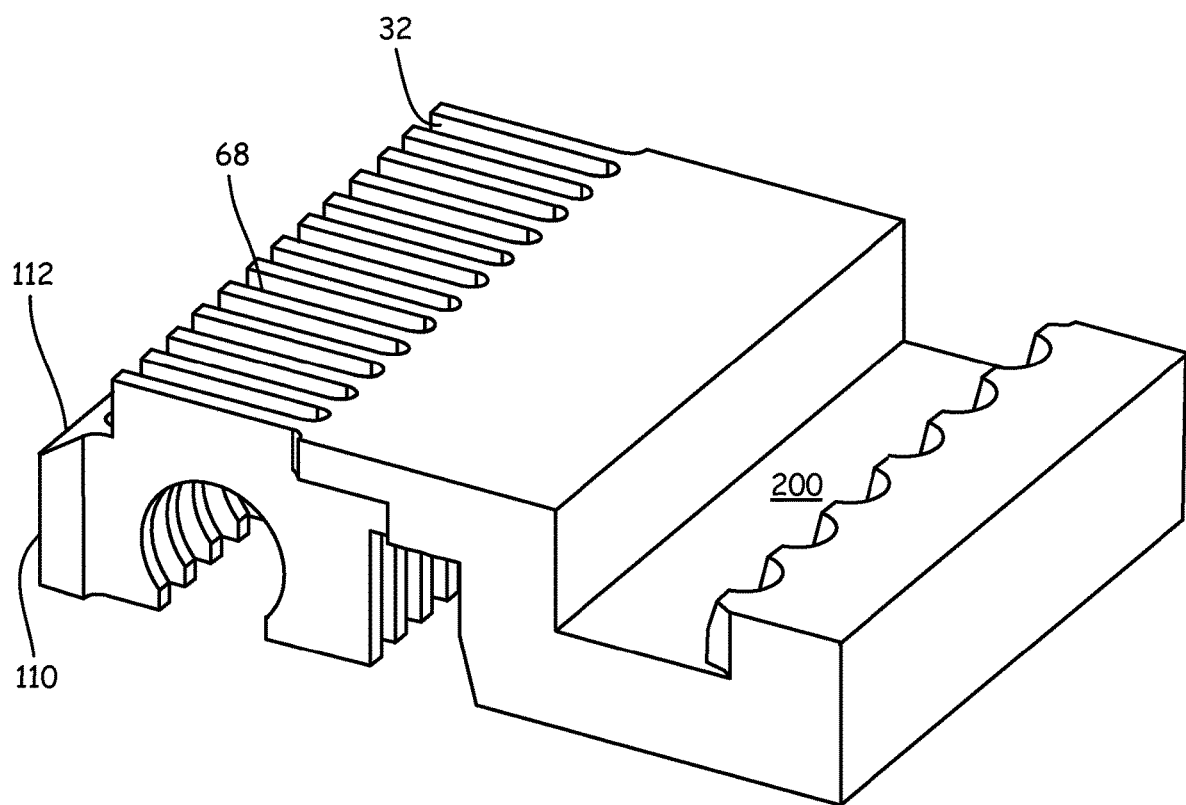
FIG. 8 is a close up perspective view of the insert in FIG. 3.

In FIGS. 2 and 5, a slot 102 is provided in the top surface of the insert. This is an optional addition to provide extra security to maintain the insert in place. This slot is matched with a like extension of the slot 104 in the base 16. This allows for a slotted bar 106 to be compressively inserted into the slots so that the bar can compress slightly on insertion and its expansion will maintains its position in the slot. Alternatively, a simple member may be glued into the slot at the ends. In FIG. 7 recess 120 is provides and in place of a removable bar, a spanning bridge (not shown but similar to bridge 200 in FIG. 4 can be provided to maintain the insert in place if needed.

In this embodiment (FIG. 5), the leading/front edge of the insert 110 includes a beveled portion 112 distant from the upper surface of the insert. Likewise the base 16 include an overhang projection 114 which provides a way to hold the insert flush with the base top surface.

FIGS. 3, 4, 7 and 8 illustrate an embodiment which is known as bottom insert. That is, the insert block inserted into the base 16 from the bottom upwardly and is prevented from passing through the base by various means disclosed herein.

Figure 3:
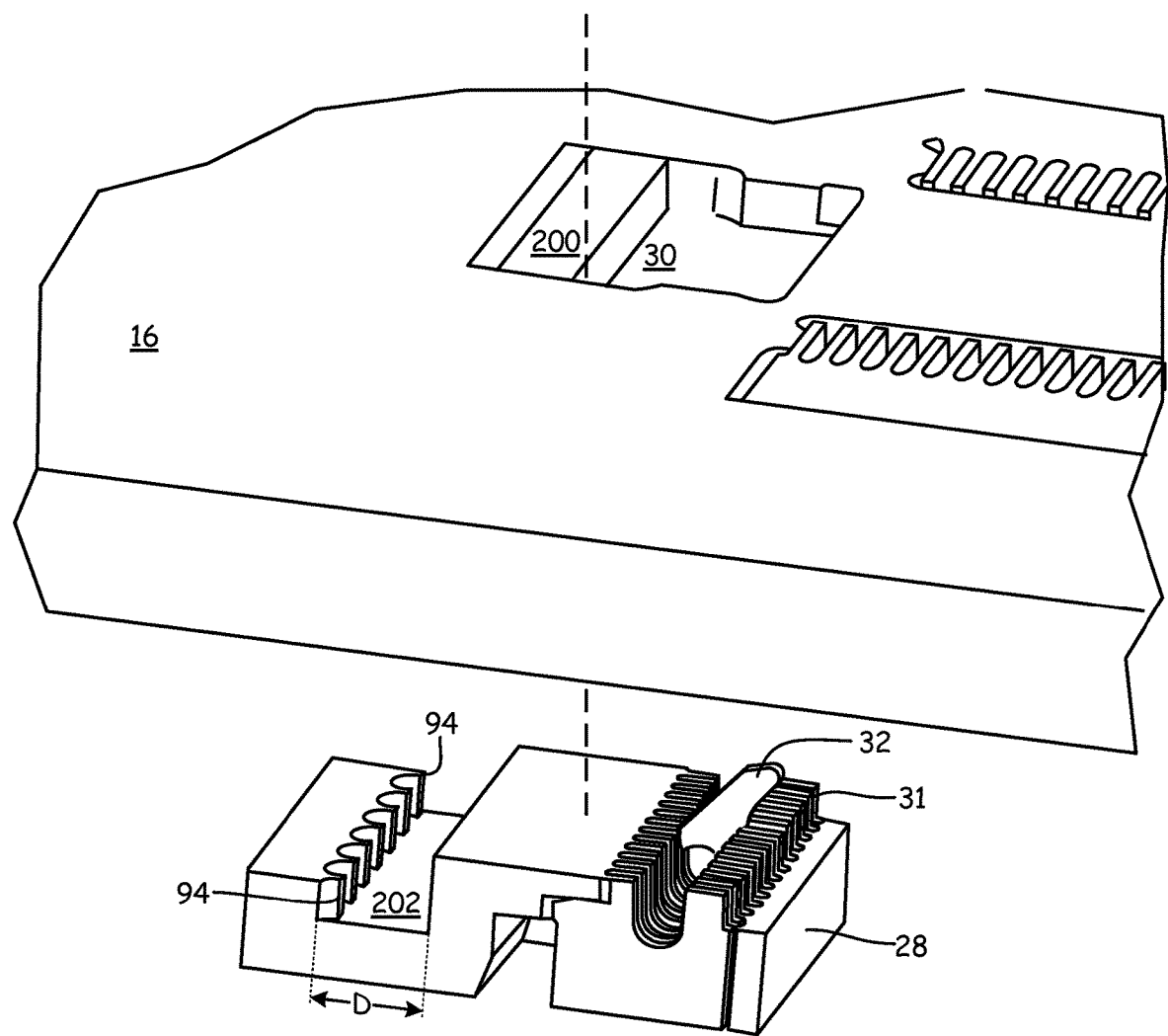
FIG. 3 is a fragmentary top view of a housing and bottom insert embodiment.
Figure 4:
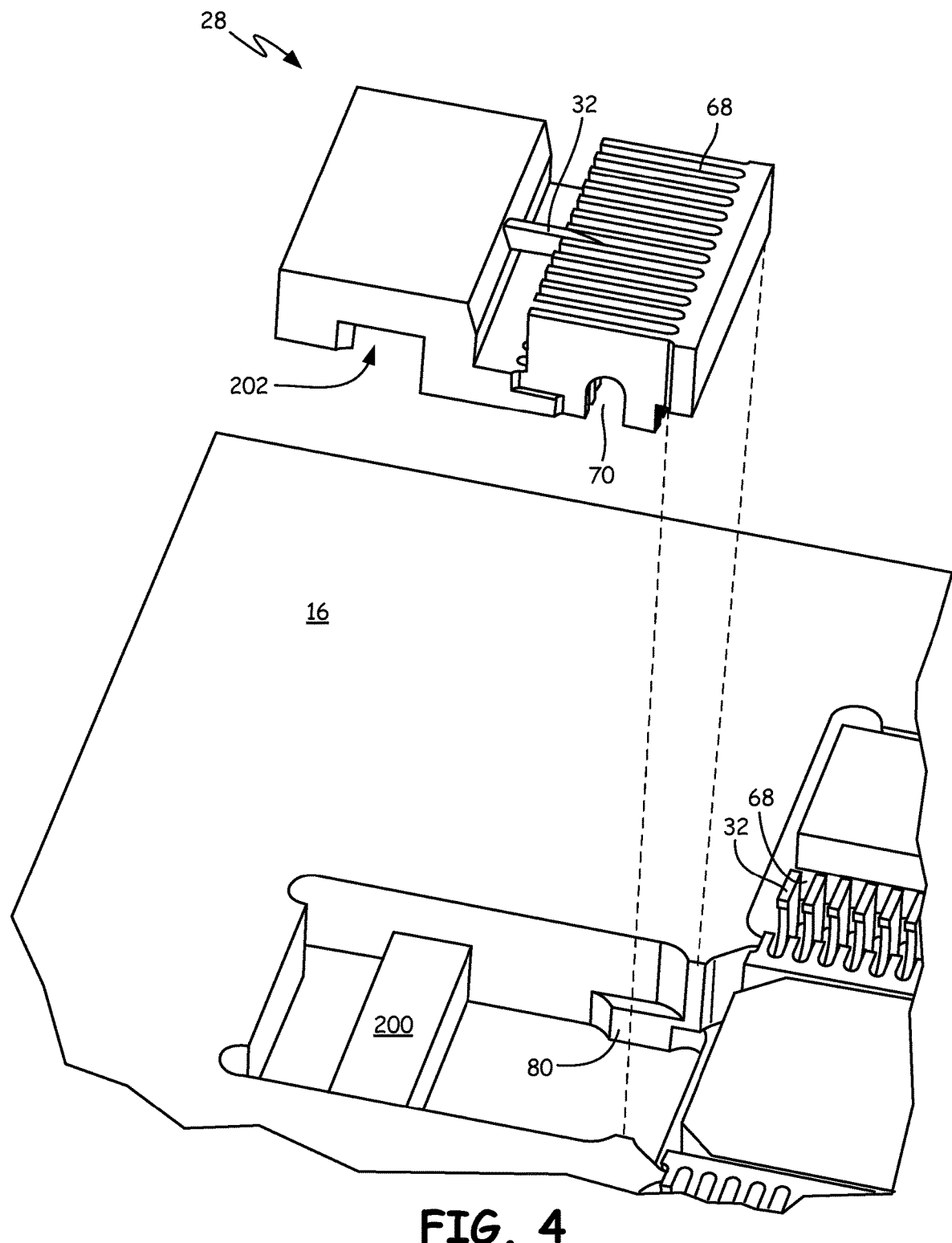
FIG. 4 is a bottom fragmentary view of a housing and bottom insert.

In FIG. 3, insert 28 is it into aperture 30 upwardly. The top surface of base 16 is shown. FIG. 4 shows the bottom surface of base 16 where bridge/cross member 200 is fully visible, this bridge proves a stop for the insert and spans laterally from the inner sidewalls. Recess/notch 202 in the tail portion of insert 28 is sized to received bridge 200 and prevent the insert from pulling though the base. Teeth 94 are pointed inwardly into notch 202 to engage bridge 200 in a manner similar to that of teeth in prior embodiments. The distance D between the teeth and the far wall of the notch is thus slightly smaller than the width of the bridge, and thus the compression of the teeth provides a bias retention force. Bosses 80 (FIG. 4) provide alignment.

In FIGS. 5 and 6, a chamfered or beveled edge 210 provides a stop for the tail 32a of pin 32. The stop minimizes the wear on the load board (not shown) or PID-peripheral interface device (FIGS. 15-16) by preventing slide of the base 32b of the pin 32 when it is rocking in response to encounters with the DUT.

FIGS. 9-14 illustrate a further embodiment directed to an insert block which have special purposes besides easy replacement. Some DUTs have high frequency or other special purpose contacts. High frequency is particularly problematic because the impedance between the pin and dielectric material for most pins may not be suitable for specialty pins. To solve this problem, the present disclosure illustrates a structure and method of providing inserts with appropriate impedance.

FIG. 9 shows the recess area 14 of base 16. Pins 32 and 232 are shown protruding slightly out of their slots. According to user needs, certain pin area have apertures 30 which allow for inserts 228 shown in detail in FIGS. 12-13.

Figure 14:
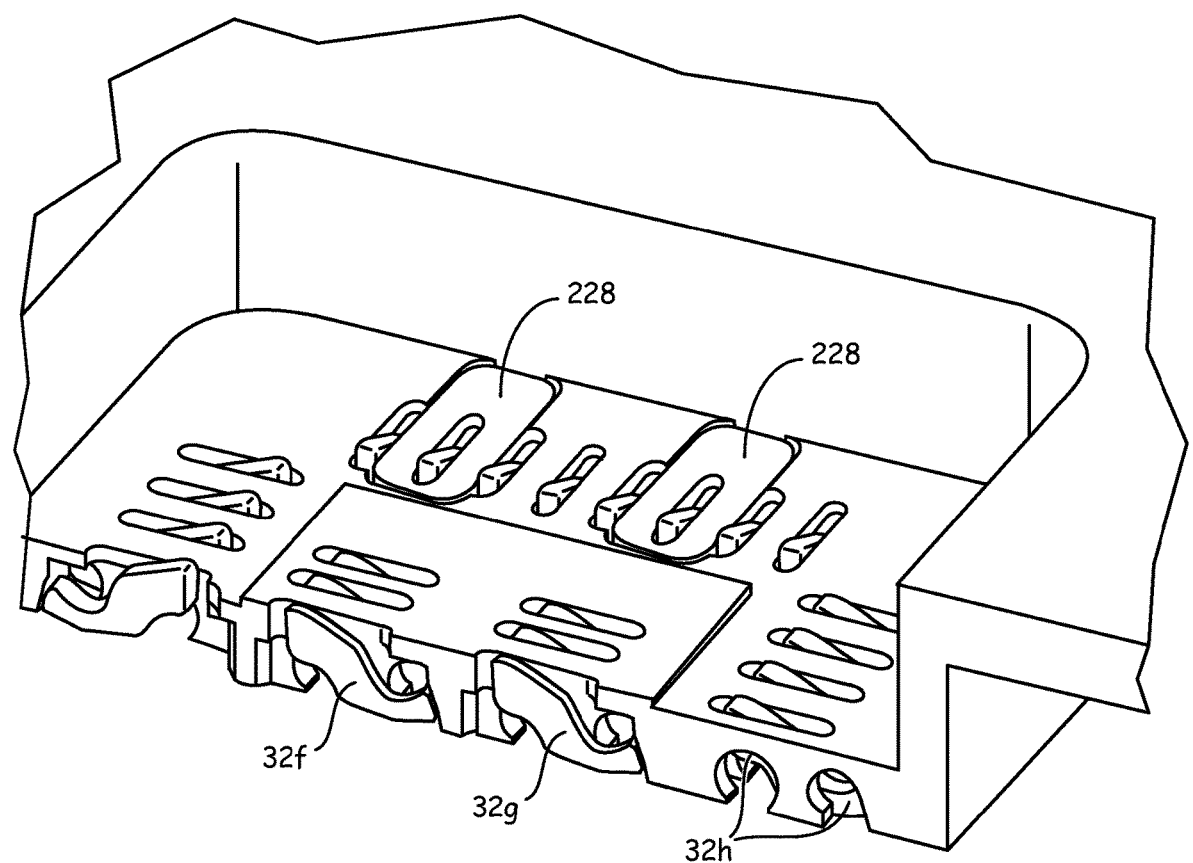
FIG. 14 is a top perspective view of FIG. 10 with portions broken away.

Insert 228 can be constructed as in the previous embodiment or as shown with a upper portion 230 which fits through aperture 30 until ledge 233 engages the bottom surface of base 16. This upper portion is preferably coplanar with the top surface of base 16 by selection of the point at which ledge 233 is located. The lower portion 234 of insert 228 therefore extends below the base 16. Passages 270 and 272 are provided for to receive elastomers which bias pin 32. The impedance of pin 232 within insert 228 can be different from the impedance of other pins 32 by varying the dielectric characteristic of the material used in this insert. The insert width must also be taken into account in order that the combination yield the desired impedance. Trial and error or modeling are ways to determine the appropriate dielectric. According to the present disclosure the user selects a dielectric material and width which produces the desired impedance and thus RF characteristic, creates a base plate with apertures at the necessary locations. By this method, a test socket can have various pin locations replaced with apertures and inserts with the desired characteristics to have a single test socket which can meet DUT requirements instead of having to run the DUT through multiple test sockets. FIG. 14 illustrates such a combination. FIG. 14 also shows that orientation of pins 32f, 32g, and 32f in the central recess region 14 which are all oriented in the same direction (tip of pin to the left in the drawing). This permits higher pin density by allowing some degree of pin overlap which would not be possible if the pins had reverse orientations with respect to each other. Elastomers are indicated at 70a and 72a.

Figure 15:
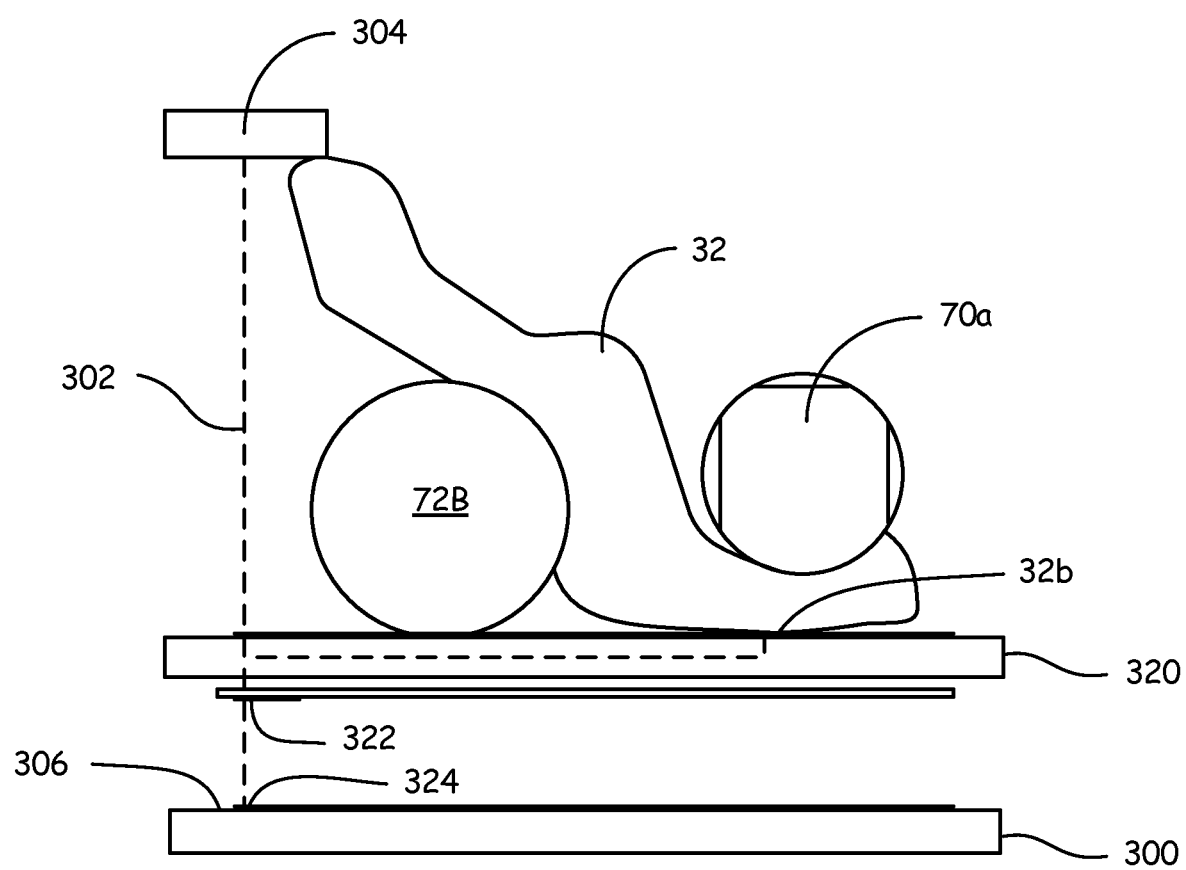
FIG. 15 is a side plan view of a pin, PID and load board.
Figure 16:
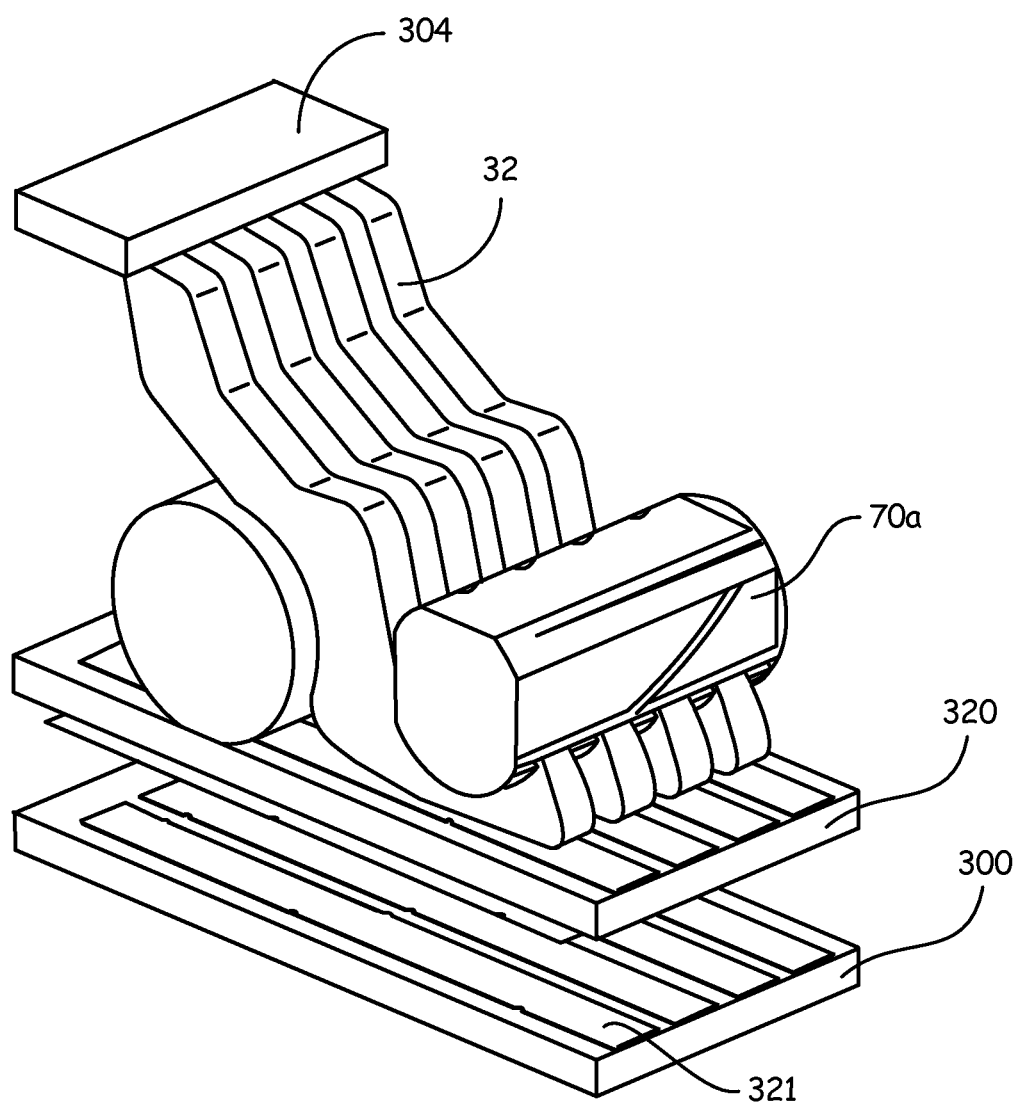
FIG. 16 is a perspective view of the subject of FIG. 15.

FIGS. 15-16 illustrate a solution to the problem of load board wear. The load board 300 carries signals from the pins 32 to test equipment. It is an expensive component and is subject of wear by the sliding action of pins 32. It contains copper traces, like a circuit board, located in specific locations. the circuit path of the system shown in FIG. 15 is from contact 304 to load board trace 306 through pin 32, onto a PID (physical interface device) board, though a via (an electrical connection within the PID) to a trace 322 on the bottom of the PID where it connects with a trace 324 on the top of load board 306. Thus by use of the PID two advantages are achieved. The contact 304 is electrically connected to contact 324 on the load board directly along axis 302 even though its actual route is offset through pin 32 and PID 320. Secondly, any sliding or rocking movement of pin 32 cases wear on the PID, not the load board, since the load board does not move relative to the PID. PIDs are less expensive and easier to replace. Vias are needed to restore the collinear/on axis electrical terminations of the path between contact and load board.

Figure 19:
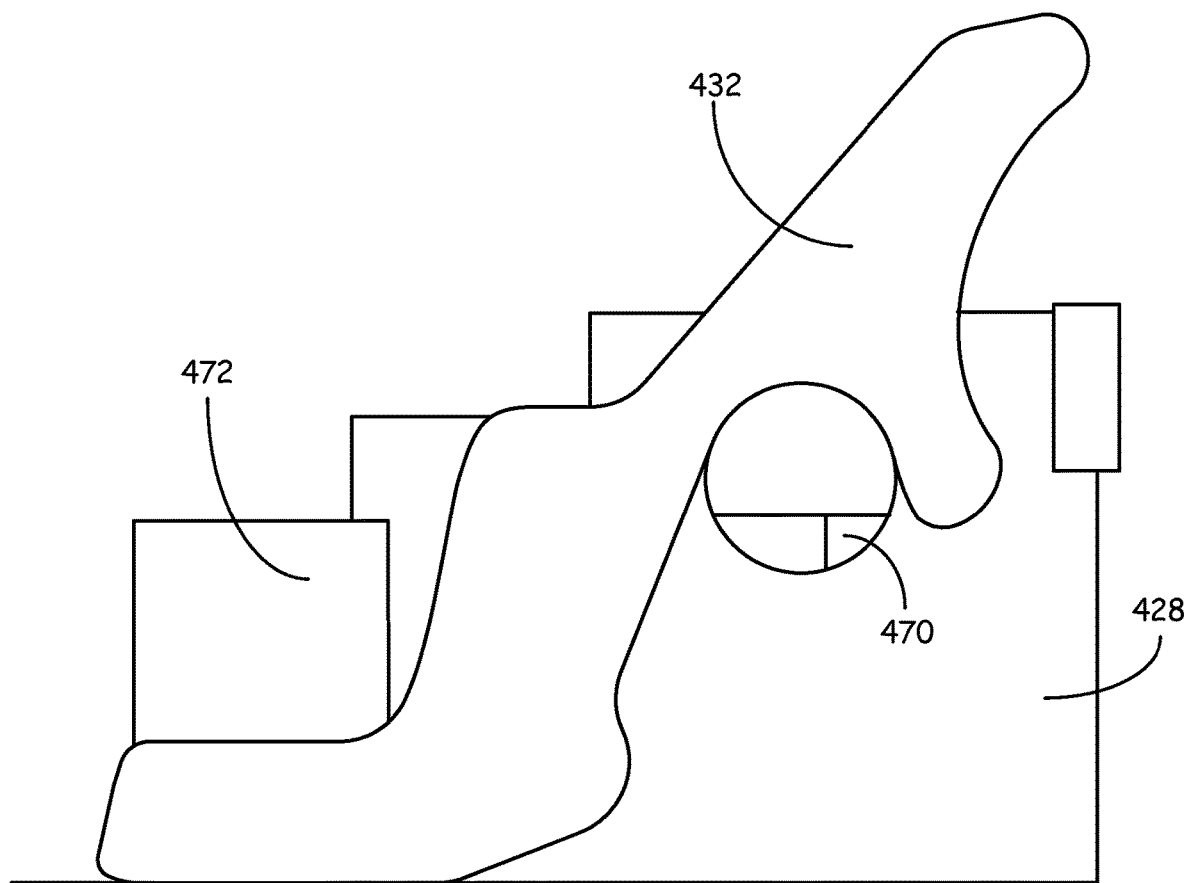
FIG. 19 is a side perspective view of an alternate pin embodiment.

FIG. 19 illustrate a hybrid pin 432 and insert 428 has elastomer passages 470 and 472 are accessible from the top surface of insert 428 so they can be added from the top, instead of top and bottom as previously seen.

In FIG. 9, the core materials is typically made of a dielectric such as Torlon® known in the art. In order to reduce pin cross talk and electromagnetic interference (EMI) it would be desirable to use a metal which can block these effects but because metals are conductors, the pins would short to ground.

To solve this problem, the body of the base can be made of conductive metal, such as aluminum. Slots for pins can be cut, milled or cast in the metal but need to make wider than would otherwise be required for pins spacing to accommodate hard anodization of inner surfaces of the slots. In most cases this means anodization of all metallic surfaces. Because the hard anodized coating is dielectric, the pins will not short to the body, but because anodizing builds of a surface thickness, the slots must be made wider. The minimum increase in slot thickness is the thickness of the pin plus the thickness of the dielectric coating, and preferably just greater than that sum to allow free movement of the pin.

The description of the disclosure and its applications as set forth herein is illustrative and is not intended to limit the scope of the disclosure. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the disclosure.

We claim:

1. A method of intermixing test pins capable of different DUT frequency response capabilities comprising the steps of:
    a. forming a test socket base having a contact portion to receive test pins to engage contacts of a DUT, said test socket being of a predetermined first material having a known frequency range for a known spacing of test pins;
    b. removing a portion of the contact portion of the base to form an aperture;

c. inserting an insert block of as second material having a different dielectric constant relative said first material, said insert block including at least one test pin, said insert block being formed to include a resilient bias portion, wherein said removed portion of the base being smaller than the insert block, so that said insert block is compressed when inserted into the base and wherein said insert block is retained in the base by bias force;

d. forming said insert block so that it replaces said portion removed, so that the frequency response of said at least one test pin in said block is user selectable regardless of the frequency response of the other test pins.

2. A test socket according to claim 1 wherein said test socket block incudes an electrically conductive material to minimize EMI and crosstalk between pins, at least some of said sidewalls being coated with a non-conductive oxide to prevent electrical contact between the block and said pins.

3. The test socket of claim 2 wherein said material is aluminum and wherein said oxide is aluminum oxide applied by hard anodization.

4. A method of intermixing test pins capable of different DUT frequency response capabilities comprising the steps of:

a. forming a test socket base having a contact portion to receive test pins to engage contacts of a DUT, said test socket being of a predetermined first material having a known frequency range for a known spacing of test pins;

b. removing a portion of the contact portion of the base to form an aperture having top and bottom faces;

c. inserting an insert block of as second material having a different dielectric constant relative said first material, said insert block including at least one test pin;

d. forming said insert block so that it replaces said portion removed, so that the frequency response of said at least one test pin in said block is user selectable regardless of the frequency response of the other test pins further including the step of forming said aperture of a predetermined dimension, and forming said insert block with at least one flange larger than said predetermined dimension of said aperture so that said block may be inserted through one face of the aperture but cannot be removed through the other face of the aperture.

5. A method of intermixing test pins capable of different DUT frequency response capabilities comprising the steps of:

forming a base having a substantially planar surface and a bottom surface and a substantially planar top surface surrounding a central insert aperture for receiving the DUT;

said insert aperture defining a peripheral boundary walls adjacent an inner periphery of the insert aperture;

forming an insert block having a predetermined impedance and having a top surface and bottom surface, said top surface configured to be substantially coplanar with said base planar top surface and said insert block having a plurality of deflectable test pins at least partially protruding above the planar surface when not engaged with the DUT and accessible through the insert aperture, so that when a DUT is placed adjacent said insert block, contacts on the DUT can engage test pins; said insert block, having a first portion sized to be received within said insert aperture, and a second portion extending from said first portion and forming a bridge member in the insert aperture includes, said bridge member spanning at least two of said boundary walls and wherein said second portion is formed including a channel generally orthogonal to the front and rear edges, said channel being formed to channel to receive said bridge member for retaining the insert block in the wherein said insert block includes a front and rear edge and a lip on both front and rear edges.

* * * * *